United States Patent
Lightner et al.

(10) Patent No.: US 9,025,892 B1
(45) Date of Patent: May 5, 2015

(54) DATA RECORD COMPRESSION WITH PROGRESSIVE AND/OR SELECTIVE DECOMPOSITION

(71) Applicant: QBASE, LLC, Reston, VA (US)

(72) Inventors: Scott Lightner, Leesburg, VA (US); Franz Weckesser, Spring Valley, OH (US); Bryan Zimmerman, Catlett, VA (US)

(73) Assignee: Qbase, LLC, Reston, VA (US)

( * ) Notice: Subject to any disclaimer, the term of this patent is extended or adjusted under 35 U.S.C. 154(b) by 0 days.

(21) Appl. No.: 14/557,900

(22) Filed: Dec. 2, 2014

Related U.S. Application Data (60) Provisional application No. 61/910,873, filed on Dec. 2, 2013.

(51) Int. Cl.
| | | |
|---|---|---|
| G06K 9/36 | (2006.01) | |
| G06F 7/00 | (2006.01) | |
| G06F 17/30 | (2006.01) | |
| G06T 9/00 | (2006.01) | |
| H03H 7/30 | (2006.01) | |

(52) U.S. Cl.
CPC .......... *G06F 17/30* (2013.01); *G06F 17/30067* (2013.01); *G06F 17/30864* (2013.01); *G06T 9/00* (2013.01); *H03H 7/30* (2013.01)

(58) Field of Classification Search
CPC .............. G06F 17/30; G06F 17/30067; G06F 17/30864; H03M 7/30; G06T 9/00
USPC .................... 707/693, 706; 382/232
See application file for complete search history.

(56) References Cited

U.S. PATENT DOCUMENTS

| | | | |
|---|---|---|---|
| 8,345,998 B2 * | 1/2013 | Malik et al. ................... | 382/239 |
| 8,423,522 B2 * | 4/2013 | Lang et al. .................... | 707/693 |
| 8,782,018 B2 * | 7/2014 | Shim et al. .................... | 707/693 |
| 2002/0165847 A1 * | 11/2002 | McCartney et al. .............. | 707/1 |
| 2007/0250519 A1 * | 10/2007 | Fineberg et al. ............. | 707/100 |
| 2009/0089626 A1 * | 4/2009 | Gotch et al. .................... | 714/45 |
| 2014/0022100 A1 * | 1/2014 | Fallon et al. .................... | 341/87 |

\* cited by examiner

*Primary Examiner* — Utpal Shah
(74) *Attorney, Agent, or Firm* — Eric L. Sophir; Dentons US LLP (57) ABSTRACT

Disclosed herein are systems and methods for compressing structured or semi-structured data in a horizontal manner achieving compression ratios similar to vertical compression. Collections include structured or semi-structured data include a number of fields and are described using a schema. Fields include information having semantic similarity and are compressed using methods suitable for compressing the type of data. Data of a collection is compressed after fragmentation or may be normalized prior to compression. Data with semantic similarity is compressed using token tables and/or n-gram tables, where higher weighted, consisting of the product of frequency and length, occurring values may be stored in the lower numbered indices of the data table. Records include record descriptor bytes, field descriptor bytes, zero or more array descriptor bytes, zero or more object descriptor bytes, or bytes representing the data associated with the record. Data is indexed or compressed by a suitable module.

26 Claims, 5 Drawing Sheets

FIG. 1

| Index | Node 1 | Node 2 | ... | Node N |
|---|---|---|---|---|
| 0 | Value 0.1 | Value 0.2 | ... | Value 0.N |
| 1 | Value 1.1 | Value 1.2 | ... | Value 2.N |
| ... | ... | ... | ... | ... |
| x | Value x.1 | Value x.2 | ... | Value x.N |

*FIG. 2*

| Index | Token Data |
|---|---|
| 0 | Value 0 |
| 1 | Value 1 |
| ... | ... |
| x | Value 2 |
| zzz | No Token Value |

FIG. 3

| Index | N-gram Data |
|---|---|
| 0 | Value 0 |
| 1 | Value 1 |
| ... | ... |
| x | Value 2 |
| zzz | No N-gram Value |

*FIG. 4*

| Record Index | Record Attributes | Node 1 | | Node 2 | | ... | Node N | |
|---|---|---|---|---|---|---|---|---|
| | | ID and Attributes | Data | ID and Attributes | Data | | ID and Attributes | Data |
| 0 | Byte(s) | Byte(s) | Value 0.1 | Byte(s) | Value 0.2 | ... | Byte(s) | Value 0.N |
| 1 | Byte(s) | Byte(s) | Value 1.1 | Byte(s) | Value 1.2 | ... | Byte(s) | Value 2.N |
| ... | ... | ... | ... | ... | ... | ... | ... | ... |
| x | Byte(s) | Byte(s) | Value x.1 | Byte(s) | Value x.2 | ... | Byte(s) | Value x.N |

FIG. 5

DATA RECORD COMPRESSION WITH PROGRESSIVE AND/OR SELECTIVE DECOMPOSITION

CROSS-REFERENCE TO RELATED APPLICATIONS

This non-provisional patent application claims the benefit of U.S. Provisional Patent Application Ser. No. 61/910,873, entitled "Data Record Compression With Progressive and/or Selective Decompression," filed Dec. 2, 2013, which is hereby incorporated herein in its entirety.

This application is related to U.S. patent application Ser. No. 14/557,794, filed Dec. 2, 2014, entitled "Method for Disambiguating Features in Unstructured Text", and U.S. patent application Ser. No. 14/558,300, filed Dec. 2, 2014, entitled "Event Detection Through Text Analysis Using Trained Event Template Models", and U.S. patent application Ser. No. 14/557, 807, filed Dec. 2, 2014 entitled "Method for Facet Searching and Search Suggestions", and U.S. patent application Ser. No. 14/558,254, filed Dec. 2, 2014, entitled "Design and Implementation of Clustered In-Memory Database", and U.S. patent application Ser. No. 14/557,827, filed Dec. 2, 2014, entitled "Real-Time Distributed in Memory Search Architecture", and U.S. patent application Ser. No. 14/557,951, filed Dec. 2, 2014, entitled "Fault Tolerant Architecture for Distributed Computing Systems", and U.S. patent application Ser. No. 14/558,009, filed Dec. 2, 2014, entitled "Dependency Manager for Databases", and U.S. patent application Ser. No. 14/558,055, filed Dec. 2, 2014, entitled "Pluggable Architecture for Embedding Analytics in Clustered In-Memory Databases", and U.S. patent application Ser. No. 14/558,101, filed Dec. 2, 2014, entitled "Non-Exclusionary Search Within In-Memory Databases", all of which are incorporated herein by reference in their entirety.

TECHNICAL FIELD

The present disclosure relates in general to data compression and databases, and more specifically to methods of compression for use in in-memory databases as well as document databases.

BACKGROUND

Computers are powerful tools of use in storing and providing access to vast amounts of information, while databases are a common mechanism for storing information on computer systems while providing easy access to users. Typically, a database is an organized collection of information stored as "records" having "fields" of information. (e.g., a restaurant database may have a record for each restaurant in a region, where each record contains fields describing characteristics of the restaurant, such as name, address, type of cuisine, and the like).

Often, databases may use clusters of computers in order to be able to store and access large amounts of data. This may require a large amount of information storage space. Often, compression may be used to reduce the amount of storage space necessary to host the information, but it may increase the computational load significantly as many common compression methods require the entire record or many records to be decompressed every time they are accessed.

As such, there is a continuing need for improved methods of storing and retrieving data at high speeds at a large scale.

SUMMARY

Disclosed here are methods for compressing structured or semi-structured data, though it should be appreciated that a variety of suitable compression algorithms may be utilized (i.e., no particular compression algorithm is required). System and method embodiments described herein may implement a combination of suitable data compression processes to each field of database, such that a compressed database record achieves a compression ratio comparable to commercially-accepted ratios, while still allowing decompression of the fields to occur only for the records and fields of interest (i.e., only decompressing data records or fields satisfying a database search query). Implementing compression techniques that facilitate selective decompression of records or fields allows for horizontal record-based storage of the compressed data, but also columnar or vertical access to the fields of the data on decompression. This provides the reduced storage benefits of compression, while avoiding much of the compute power and latency associated with decompression when only specific fields are to be decompressed.

Systems and methods described herein may also implement N-gram compression techniques. Conventionally, N-grams are restricted to compressing only one of chains of letters (successive characters of a string), or to chains of words (successive strings in text). Conventional N-gram compression is unable to compress chains of letters, individual words, and/or chains of words, within a single implementation of such a compression technique. Described herein is the use of N-gram-related compression for columnar compression during record storage, thereby allowing good overall compression, while still providing low-latency access to a single record or a single field within a record, in response to search queries.

Systems and methods described herein describe embodiments of compression techniques as applying to in-memory databases and document databases. However, it should be appreciated that such techniques and other aspects of the systems and methods may be applied to more general data compression.

In one embodiment, a computer-implemented method comprises determining, by a computer, a compression technique to apply to one or more data elements received in a set of data elements, wherein the computer uses a schema to determine the compression technique to apply to each data element based on a data type of the data element; compressing, by a computer, a data element using the compression technique defined by the schema, wherein the compression technique compresses the data element such that the data element is individually decompressed when returned in response to a search query; storing, by the computer, each compressed data element in a field of a record that stores data of the data type of the data element; associating, by the computer, a field notation in a reference table for each field according to a schema, wherein the representative notation identifies the data type of the field; querying, by the computer, the database for a set of one or more data elements satisfying a search query received from a search conductor; and decompressing, by the computer, each of the one or more data elements of the one or more data elements satisfying the search query using the compression technique to apply responsive to identifying the set one or more data elements satisfying the search query, wherein each data element not satisfying the search query remains compressed.

In another embodiment, a computing system comprises one or more nodes storing one or more collections, each collection comprising a set of one or more records, each record comprising a set of fields storing data; and a compression processor compressing one or more of the fields according to a schema that is associated with a collection.

Numerous other aspects, features and benefits of the present disclosure may be made apparent from the following detailed description.

BRIEF DESCRIPTION OF THE DRAWINGS

The present disclosure can be better understood by referring to the following figures. The components in the figures are not necessarily to scale, emphasis instead being placed upon illustrating the principles of the disclosure. In the figures, reference numerals designate corresponding parts throughout the different views.

DEFINITIONS

As used here, the following terms may have the following definitions:

"Node" refers to a computer hardware configuration suitable for running one or more modules.

"Cluster" refers to a set of one or more nodes.

"Module" refers to a computer software component suitable for carrying out one or more defined tasks.

"Collection" refers to a discrete set of records.

"Record" refers to one or more pieces of information that may be handled as a unit.

"Field" refers to one data element within a record.

"Object" refers to a logical collection of fields within a data record.

"Array" refers to an ordered list of data values within a record.

"Node" refers to a field, object, or array within a record.

"Partition" refers to an arbitrarily delimited portion of records of a collection.

"Schema" refers to data describing one or more characteristics of a collection, record, or field.

"Compress" may refer to reducing the amount of electronic data needed to represent a value.

"Dictionary" may refer to any computerized list suitable for use as a value reference.

"Token Table" refers to a table defining one or more simpler values for one or more other more complex values.

"N-gram" refers to N successive integral units of data which can be characters, words, or groups of words where N is greater than or equal to 1. I.e. in the sentence "The quick brown fox jumped over the lazy dog.", "the", "e", "he", and "brown fox" are all valid N-grams.

"N-gram Table" refers to a table defining one or more simpler values for one or more other more complex values.

"Search Conductor", or "S.C.", refers to a module configured to at least run one or more queries on a partition and return the search results to one or more search managers.

"Partitioner" refers to a module configured to at least divide one or more collections into one or more partitions.

"Database" refers to any system including any combination of clusters and modules suitable for storing one or more collections and suitable to process one or more queries.

"Query" refers to a request to retrieve information from one or more suitable partitions or databases.

"Memory" refers to any hardware component suitable for storing information and retrieving said information at a sufficiently high speed.

"Fragment" refers to separating records into smaller records until a desired level of granularity is achieved.

"JSON" refers to the JavaScript Object Notation, a data-interchange format.

"BSON" refers to Binary JSON, a data-interchange format.

"YAML" refers to the coding language "YAML Ain't Markup Language," a data-interchange format.

"Document" refers to a group of structured or semi-structured information.

"Document Database" refers to a document-oriented database, designed for storing, retrieving, and managing document-oriented information.

DETAILED DESCRIPTION

The present disclosure describes methods for compressing structured or semi-structured data. In one or more embodiments, one or more collections may include structured or semi-structured data that may include any number of records and any suitable number of fields, where the collections may be described using any suitable schema that may define the data structure and the compression method used for one or more fields.

In one or more embodiments, one or more fields may include information that may have a semantic similarity. In one or more embodiments, the fields may be compressed using one or more methods suitable for compressing the type of data stored in the field, where token tables, N-gram compression, serial day number compression, binary number compression, or any other suitable method may be used.

In one or more embodiments, one or more data in one or more records of a collection may include data that may be better compressed after fragmentation and fragmented data may be stored contiguously in the same partition. In one or more embodiments, fragmented record identifiers may be used to identify which record they were fragmented from to ensure the system remains aware that the records originate from the same original record in the collection. Data that would be duplicated across fragments will only have a single representation in the compressed form with an anchor to which other fragments can refer.

In one or more embodiments, a record may contain an array of data values. Arrays may contain zero or more values. Values may be fields, objects, or other arrays.

In one or more embodiments, one or more data values may be grouped as an object. Objects may contain fields, other objects, or arrays, and may be elements of other objects or arrays. Objects within a record may be compressed further by including an anchor value that refers the system to another object or fragment in the partition with identical values. When a module may output data to other modules in the system, the module may replace the referring object with the actual object values.

In one or more embodiments, input records may be semi-structured data and may be represented using JSON, BSON, YAML or any other suitable data format.

In one or more embodiments, one or more data fields may be normalized prior to compression.

In one or more embodiments, fields including data with a suitably semantic similarity may be compressed using any suitable token table. When one or more records may be added to a field with an associated token table the system determines whether the data may match previously encountered data in the token table. In one or more embodiments, if the data does not match, the system may use an alternate compression method or may update the token table. In other embodiments, the token table may be updated periodically.

In one or more embodiments, fields including data with a suitably semantic similarity may be compressed using any suitable n-gram table. When one or more records may be added to a field with an associated n-gram table the system determines whether the data may match previously encountered data in the n-gram table. In one or more embodiments, if the data does not match, the system may use an alternate compression method or may update the n-gram table. In other embodiments, the n-gram table may be updated periodically.

In one or more embodiments, the most frequently occurring values may be stored in the lower numbered indices, which may allow for the most frequently used values to be represented with fewer bytes.

In one or more embodiments, a longer value may be preferred over a shorter value for inclusion in the token table, which may allow for greater compression by eliminating longer values with the same index size as a smaller value.

In one or more embodiments, a longer value may be preferred over a shorter value for inclusion in the n-gram table, which may allow for greater compression by eliminating longer values with the same index size as a smaller value.

In one or more embodiments, records may include zero or more record descriptor bytes, any suitable number of field descriptor bytes, any suitable number of array descriptor bytes, any suitable number of object descriptor bytes, and any suitable number of bytes representing the data associated with the record.

In one or more embodiments, data in a field associated with a token table may use one or more bits to state whether the information stored in the record is compressed using the compression method defined in the schema or whether another compression method, such as n-gram compression, was used.

In one or more embodiments, length or offset data included in the one or more record descriptor bytes, field descriptor bytes, array descriptor bytes, and/or object descriptor bytes may be used to navigate through the compressed data without decompressing the records, arrays, objects, or fields.

Figure 1:
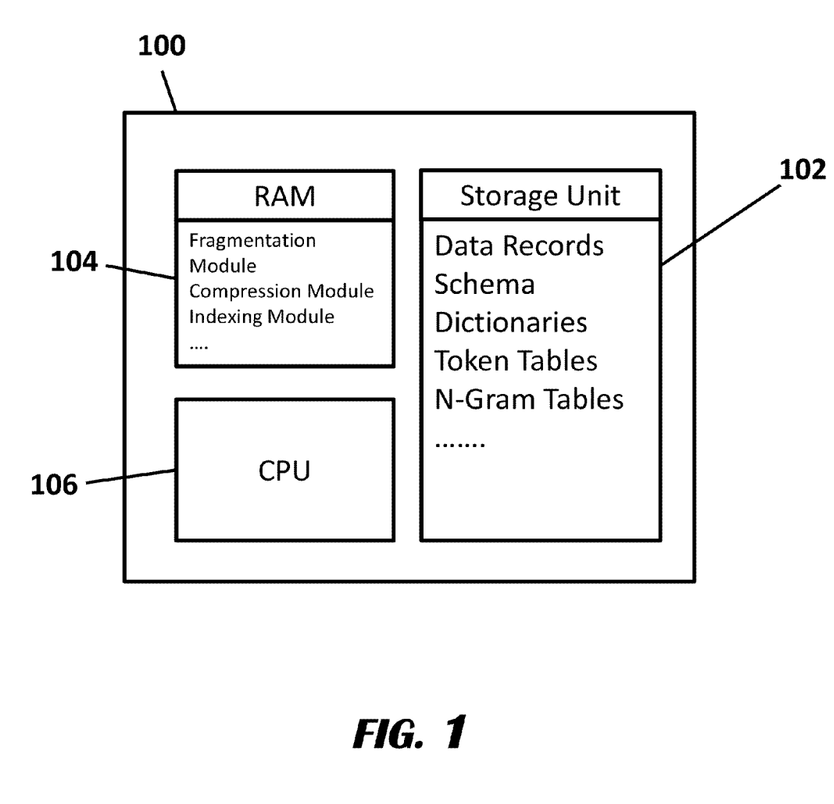
FIG. 1 illustrates a data compression apparatus according to an exemplary embodiment.

FIG. 1 shows Compression Apparatus 100 including Storage Unit 102, RAM 104, and CPU 106.

Figure 2:
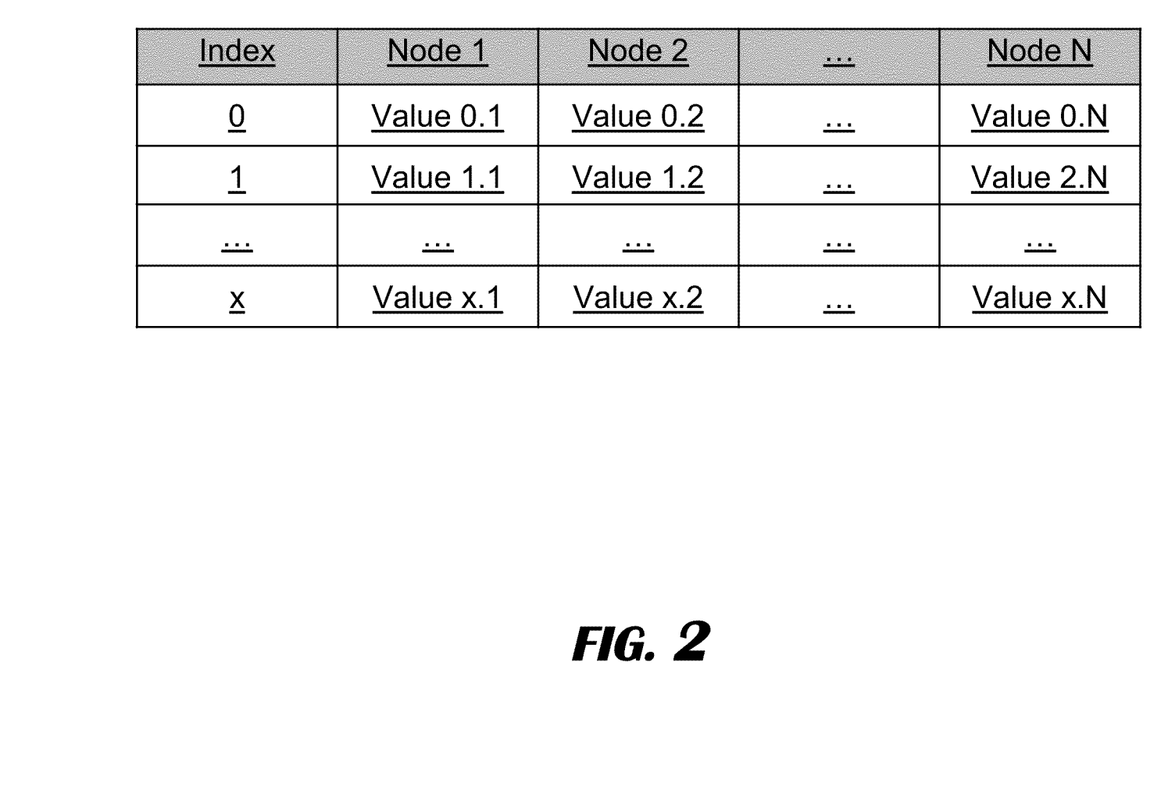
FIG. 2 illustrates a structured data table according to an exemplary embodiment.

In one or more embodiments, one or more of a collection of data records, one or more schema, one or more dictionaries, one or more n-gram tables, and one or more token tables may be stored in a hardware Storage Unit 102 in Compression Apparatus 100. RAM 104 in Compression Apparatus 100 may have loaded into it any data stored in Storage Unit 102, as well as any suitable modules, including Fragmentation Modules, Compression Modules, and Indexing Modules, amongst others. In one or more embodiments, Compression Apparatus 100 may include one or more suitable CPUs 106, FIG. 2 shows Collection Data Table 200.

In one or more embodiments, one or more collections may include structured or semi-structured data as shown in Collection Data Table 200. In one or more embodiments, the structured data may contain any number of fields, and the semi-structured data, such as data represented using JSON, BSON, YAML or any other suitable format, may contain that may include any suitable number of fields, arrays, or objects. Collections may be described using any suitable schema, where suitable schema may define the data structure and the compression method used for one or more fields in the schema.

In one or more embodiments, one or more fields may include data values that may have a semantic similarity. In one or more embodiments, semantically similar data may include first names, last names, date of birth, and citizenship, amongst others. In one or more embodiments, a compression apparatus may compress one or more fields using one or more methods suitable for compressing the type of data stored in the field, where the compression apparatus may use custom token tables. In one or more embodiments, a compression apparatus may use n-gram compression as a default compression method for any number of fields with data not associated with a desired method of compression.

In one or more embodiments, one or more data in one or more fields of a collection may include data that may be better compressed after fragmentation. This type of data is typically where fields have multiple values per record, and a compression apparatus may better achieve matching and scoring by de-normalizing those records into multiple record fragments. Examples of data suitable for fragmentation may include full names, addresses, phone numbers and emails, amongst others. In one or more embodiments, a compression apparatus may fragment one or more data prior to compression. A compression apparatus may store fragmented data contiguously in the same partition. In one or more embodiments, a compression apparatus may use fragmented record identifiers to identify which record they were fragmented from to ensure the system remains aware that the records originate from the same original record in the collection.

In one or more embodiments, a record may contain an array of data values. Arrays may contain zero or more values and array values may have a null value to represent a missing value while preserving the proper order of values.

In one or more embodiments, a compression apparatus may group one or more data fields as an object. Objects may contain other objects and may be elements in an array. A compression apparatus may further compress objects within a record by including a value that refers the system to another object in the partition with identical values. When a module may output data to other modules in the system, the module may replace the referring object with the actual object values.

In one or more embodiments, a compression apparatus may compress one or more data in fields representing numbers using known binary compression methods.

In one or more embodiments, a compression apparatus may compress one or more data in fields representing dates using known Serial Day Number compressions algorithms.

In one or more embodiments, a compression apparatus may normalize one or more data prior to compression. Data suitable for normalization prior to compression may include street suffixes and prefixes, name suffixes and prefixes, and post/pre directional information (i.e. east, north, west, amongst others), amongst others.

Figure 3:
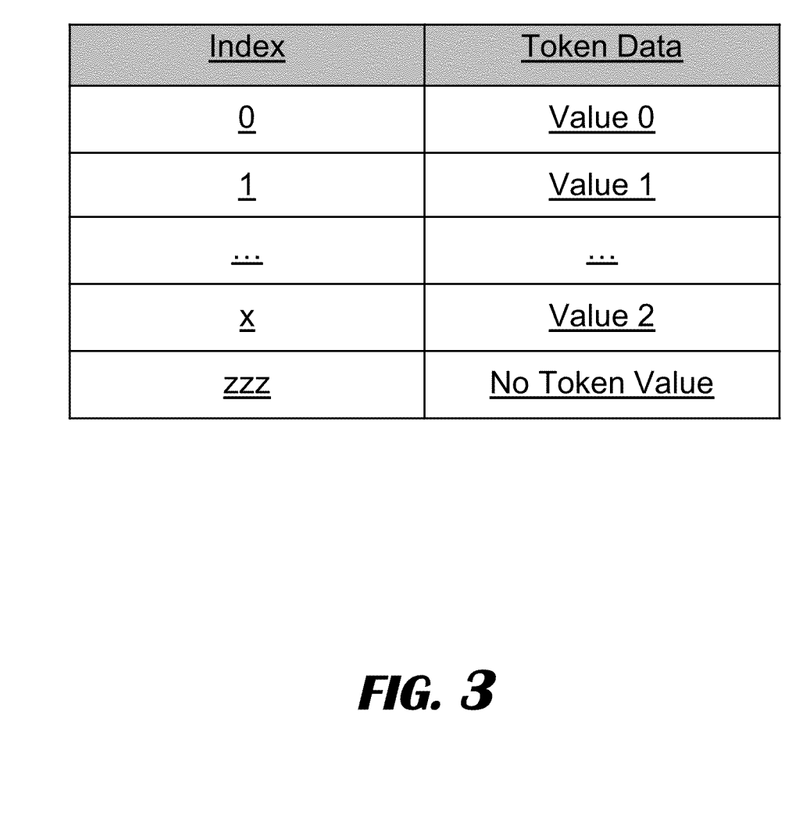
FIG. 3 illustrates a token table according to an exemplary embodiment.

FIG. 3 shows Token Table 300.

In one or more embodiments, a compression apparatus may compress fields including data with a suitably semantic similarity using any suitable token table, where suitable token tables may be similar to Token Table 300.

In one or more embodiments, when one or more records may be added to a field with an associated token table the system determines whether the data may match previously encountered data in the token table. In one or more embodiments, if the data does not match, the system may use an alternate compression method instead of token tables. In one or more other embodiments, if the data does not match, the system may update its token table so as to include the data.

In one or more embodiments, the token table may be updated periodically and stored data may be re-evaluated to determine if compressibility has improved. If the compressibility of one or more data has improved, the system may decompress and re-compress any suitable data.

In one or more embodiments, the most frequently occurring values may be stored in the lower numbered indices, which may allow for the most frequently used values to be represented with fewer bytes.

In one or more embodiments, a longer value may be preferred over a shorter value for inclusion in the token table, which may allow for greater compression by eliminating longer values with the same index size as a smaller value.

In one or more embodiments a special index value may be reserved to indicate that no token data exists for the data value.

Figure 4:
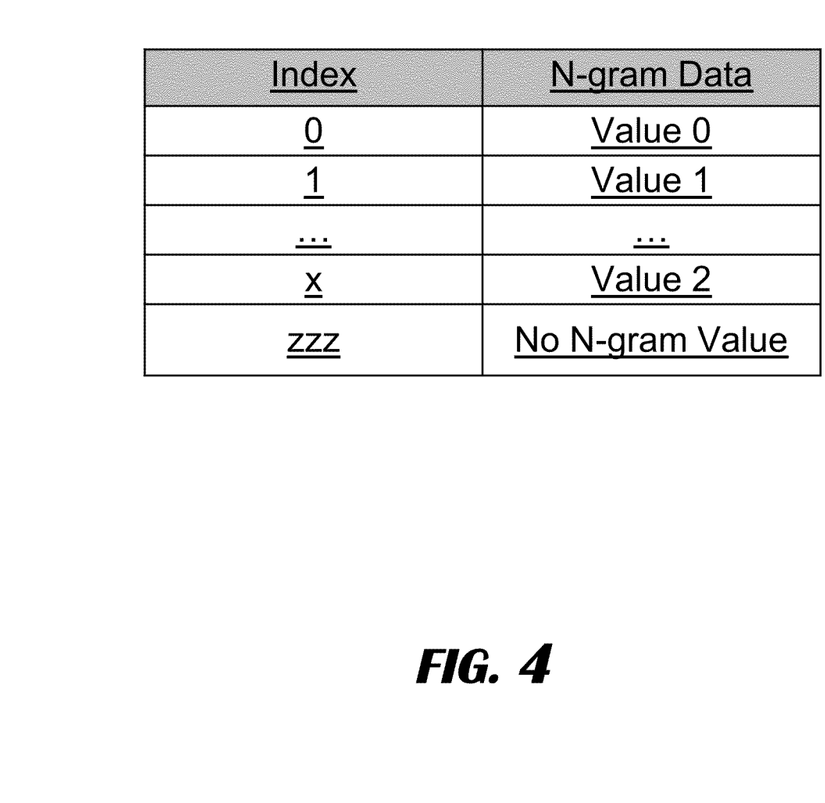
FIG. 4 illustrates a n-gram table according to an exemplary embodiment.

FIG. 4 shows N-gram Table 400.

In one or more embodiments, a compression apparatus may compress fields including data with a suitably semantic similarity using any suitable n-gram table, where suitable n-gram tables may be similar to N-gram Table 400.

In one or more embodiments, when one or more records may be added to a field with an associated n-gram table the system determines whether the data may match previously encountered data in the n-gram table. In one or more embodiments, if the data does not match, the system may use an alternate compression method instead of n-gram tables. In one or more other embodiments, if the data does not match, the system may update its n-gram table so as to include the data.

In one or more embodiments, the n-gram table may be updated periodically and stored data may be re-evaluated to determine if compressibility has improved. If the compressibility of one or more data has improved, the system may decompress and re-compress any suitable data.

In one or more embodiments, the most frequently occurring values may be stored in the lower numbered indices, which may allow for the most frequently used values to be represented with fewer bytes.

In one or more embodiments a special index value may be reserved to indicate that no n-gram data exists for the data value.

Figure 5:
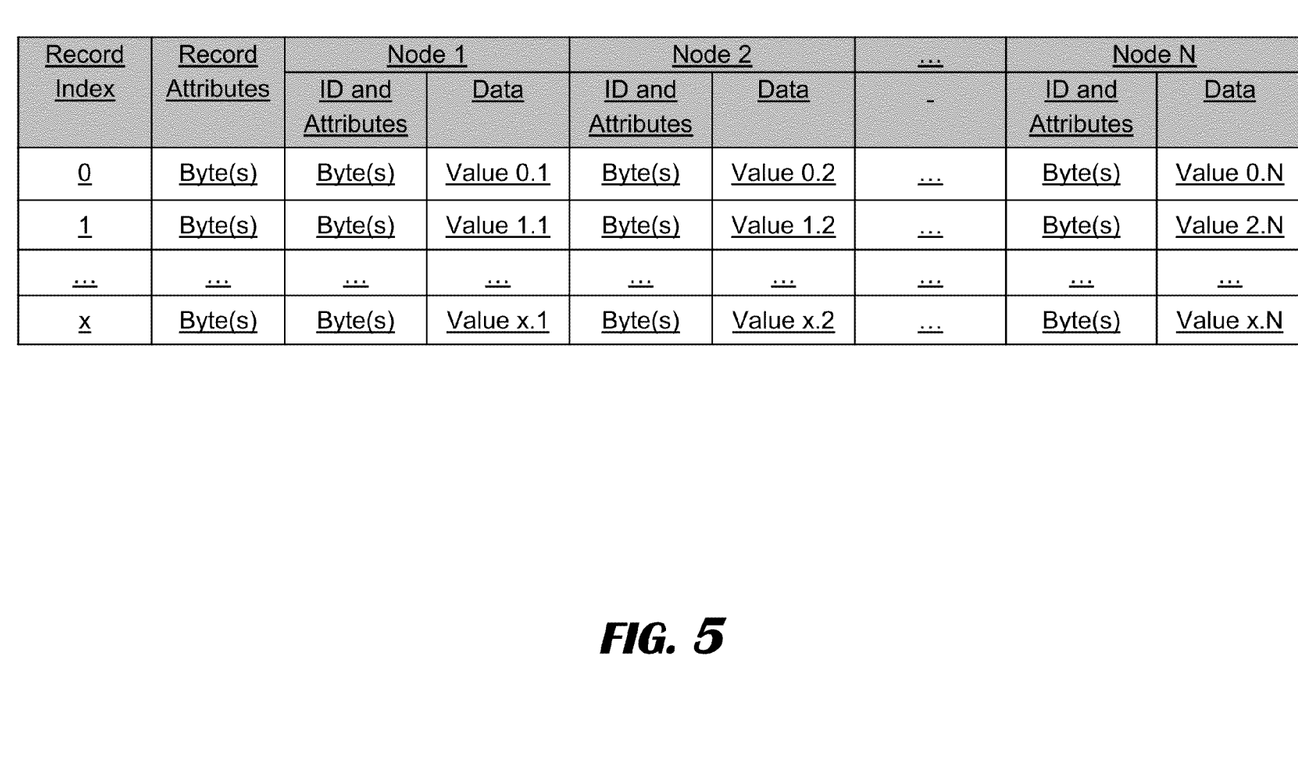
FIG. 5 illustrates a table describing compressed records according to an exemplary embodiment.

FIG. 5 shows Record Representation 500, which may represent compressed data in one or more embodiments.

In Record Representation 500, each row value in the record index column may include zero or more record descriptor bytes with information about the record, including the length, offset, or the record's location in memory amongst others. In one or more embodiments, each data node (array, field, or object) present in the record may include zero or more descriptor bytes, where suitable information about the node may be included, including a node identifier, the length of the stored data, and number of elements of the array if applicable. Following the zero or more node descriptor bytes, any suitable number of bytes may represent the data associated with the record. In one or more embodiments, the data may include one or more bits describing the contents of the data including array separation marker bits.

In one or more embodiments, data in a field associated with a token table may use one or more bits to state whether the information stored in the record is represented in a suitable Token Table, or whether another suitable compression method, such as N-gram compression, was used.

In one or more embodiments, a system may use length or offset data included in the one or more record descriptor bytes and/or the one or more node (array, object, or field) descriptor bytes to navigate through the compressed data without decompressing the records or nodes (arrays, objects, or fields).

In one or more embodiments, any suitable module in a system may index or compress data, including one or more search conductors or one or more partitioners in a MEMDB system.

In one or more embodiments, a compression apparatus employing one or more compression methods here disclosed allow data to be compressed at rates similar to other prominent compression methods while allowing data to be decompressed and/or accessed at the node (array, object, or field) level.

In one or more embodiments, a compression apparatus employing one or more compression methods here disclosed allow the system to skip individual records and nodes (arrays, objects, or fields) when accessing information in the records.

In one or more embodiments, a compression apparatus employing one or more compression methods here disclosed allow the system to exit decompression of a record early when the target fields are found.

Example #1 illustrates a method for compressing names using a compression apparatus.

In this example, a data set includes a collection including one million full name records with 350 unique first names and 300 unique last names represented. The records were fragmented into a first name field and a last name field.

The individual tokens were then weighted via the product of their frequency and length from highest to lowest. Tokens with a weight less than a certain threshold were discarded to reduce the token table size.

A token table was then generated for each field by maximizing the aggregate space savings in assigning indices whereby space savings for an individual token is the product of frequency and the sum of its length minus stored index length.

The number of entries associated with single byte indices was varied from 1 to 255 to inclusive during the maximization procedure.

The algorithm guarantees that the generated token table is optimal, and the highest savings will go to the single byte stored index entries while subsequent values compress to two or more bytes. Short or infrequent entries may realize no savings and are not be included in the token table. These values revert to another compression method such as n-gram compression.

Example #2 illustrates a method for compressing text using a compression apparatus.

In this example, a large body of text was analyzed for frequency of n-grams where n-grams can represent successive sequences of characters, words, or groups or words. The text is usually acquired via analyzing a large column of field data in order to achieve columnar compression results in a field by field horizontal compression.

The individual n-grams were then weighted via the product of their frequency and length from highest to lowest. N-grams with a weight less than a certain threshold were discarded to reduce the n-gram table size.

A n-gram table was then generated for the field by maximizing the aggregate space savings in assigning indices whereby space savings for an individual n-gram is the product of frequency and the sum of its length minus stored index length.

The number of entries associated with single byte indices was varied from 1 to 255 to inclusive during the maximization procedure.

The algorithm guarantees that the generated n-gram table is optimal, and the highest savings will go to the single byte stored index entries while subsequent values compress to two or more bytes. Infrequent entries may realize no savings and are not be included in the n-gram table. These values revert to some other method of basic storage.

An example of some of the n-grams generated in the table via this method is as follows:

| Index | N-gram |
|-------|--------|
| 1     | e      |
| 11    | th     |
| 47    | and    |
| 800   | out of |

During compression the field data is compressed from beginning to end using a greedy algorithm to replace the largest amount of data as possible with an indexed value until the entire data is consumed.

Example #3 is a method for compressing semi-structured data in JSON documents using a compression apparatus.

In this example, JSON input documents are compressed using the following schema, with token table compression for Title, FirstName, LastName, NameSuffix and PhoneType fields, Serial Day Number compression for DateOfBirth field and number n-gram compression for PhoneNumber field:

{"collection": "Example 2",
"record": [
{"id": "1","type": "FIELD","name": "Title","compressionMethod": "TitleNameTokenTable"},
{"id": "2", "type": "FIELD", "name": "FirstName", "compressionMethod": "FirstNameTokenTable"},
{"id": "3", "type": "FIELD", "name": "LastName", "compressionMethod": "LastNameTokenTable"},
{"id": "4", "type": "FIELD", "name": "NameSuffix", "compressionMethod": "NameSuffixNameTokenTable"},
{"id": "5", "type": "FIELD", "name": "DateOfBirth", "compressionMethod": "SerialDayNumber"},
{"id": "6", "type": "ARRAY", "name": "Phones", "array": [
{"id": "7", "type": "STRUCT", "struct": [
{"id": "8", "type": "FIELD", "name": "PhoneType", "compressionMethod": "PhoneTypeTokenTable"},
{"id": "9", "type": "FIELD", "name": "PhoneNumber", "compressionMethod": "NumberNgramTable"},
]}
]}
]}

The input record below requires 266 bytes to be represented in JSON (after removing unnecessary whitespace). After compressing, using the compression methods described in the schema above, the resulting compressed record requires only 44 bytes.

{"Title": "Dr.",
"FirstName": "Johnathan",
"LastName": "Patterson",
"NameSuffix": "M.D.",
"DateOfBirth": "19600101",
"Phones": [
{"PhoneType": "Office", "PhoneNumber": "1234567890"},
{"PhoneType": "Mobile", "PhoneNumber": "2345678901"},
{"PhoneType": "Home", "PhoneNumber": "3456789012"}
]}

The input record below requires 108 bytes to be represented in JSON (after removing unnecessary whitespace). After compressing, using the compression methods described in the schema above, the resulting compressed record requires only 13 bytes.

{"Title": "Dr.",
"FirstName": "Johnathan",
"LastName": "Patterson",
"NameSuffix": "M.D.",
"DateOfBirth": "19600101"
}

Example #4 is an example of fragmenting a record. In this example, the 53rd record of a collection includes data for a couple, Bob and Carol Wilson, having a first and second address. In this example, the record is fragmented as shown in the following table.

|            | Record Index | Name                 | Address              |
|------------|--------------|----------------------|----------------------|
| Original   | 53           | Bob and Carol Wilson | Address 1, Address 2 |
| Fragmented | 53.1         | Bob                  | Address 1            |
|            | 53.2         | Bob                  | Address 2            |
|            | 53.3         | Carol                | Address 1            |
|            | 53.4         | Carol                | Address 2            |

The record index is maintained to ensure the system remains aware that the records originate from the same original record in the collection. In this example, the fragmented records further compress the data by including a value that refers the system to the previous record in the partition, i.e. when the system accesses record the name of record 53.2, the value refers the system back to the value for the name in record 53.1. When the system in Example #4 outputs data to other modules in the system, even in compressed format, the module replaces the referring values for the actual values.

Example #5 is an example of compression for archiving semi-structured data. In this example, JSON documents from a document oriented database such as MongoDB, Cassandra, or CouchDB are compressed using a schema that defines all the desired fields, including the unique identifier of each JSON document. An index is then created that maps the unique identifier to the compressed record. The resulting compressed records and index consume less than 15% of the storage required for the original document-oriented database and each JSON document or select fields of a document can be immediately accessed without decompressing unwanted data.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

Embodiments implemented in computer software may be implemented in software, firmware, middleware, microcode, GPUs, hardware description languages, or any combination thereof. A code segment or machine-executable instructions may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

The actual software code or specialized control hardware used to implement these systems and methods is not limiting of the invention. Thus, the operation and behavior of the systems and methods were described without reference to the specific software code being understood that software and control hardware can be designed to implement the systems and methods based on the description herein.

When implemented in software, the functions may be stored as one or more instructions or code on a non-transitory computer-readable or processor-readable storage medium. The steps of a method or algorithm disclosed herein may be embodied in a processor-executable software module which may reside on a computer-readable or processor-readable storage medium. A non-transitory computer-readable or processor-readable media includes both computer storage media and tangible storage media that facilitate transfer of a computer program from one place to another. A non-transitory processor-readable storage media may be any available media that may be accessed by a computer. By way of example, and not limitation, such non-transitory processor-readable media may comprise RAM, ROM, EEPROM, CD-ROM or other optical disk storage, magnetic disk storage or other magnetic storage devices, or any other tangible storage medium that may be used to store desired program code in the form of instructions or data structures and that may be accessed by a computer or processor. Disk and disc, as used herein, include compact disc (CD), laser disc, optical disc, digital versatile disc (DVD), floppy disk, and blu-ray disc where disks usually reproduce data magnetically, while discs reproduce data optically with lasers. Combinations of the above should also be included within the scope of computer-readable media. Additionally, the operations of a method or algorithm may reside as one or any combination or set of codes and/or instructions on a non-transitory processor-readable medium and/or computer-readable medium, which may be incorporated into a computer program product.

The preceding description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the following claims and the principles and novel features disclosed herein.

What is claimed is:

1. A computer-implemented method comprising:
   determining, by a computer, a compression technique to apply to one or more data elements received in a set of data elements, wherein the computer uses a schema to determine the compression technique to apply to each data element based on a data type of the data element;
   compressing, by a computer, a data element using the compression technique defined by the schema, wherein the compression technique compresses the data element such that the data element is individually decompressed when returned in response to a search query;
   storing, by the computer, each compressed data element in a field of a record that stores data of the data type of the data element;
   associating, by the computer, a field notation in a reference table for each field according to a schema, wherein the representative notation identifies the data type of the field;
   querying, by the computer, the database for a set of one or more data elements satisfying a search query received from a search conductor; and
   decompressing, by the computer, each of the one or more data elements of the one or more data elements satisfying the search query using the compression technique to apply responsive to identifying the set one or more data elements satisfying the search query, wherein each data element not satisfying the search query remains compressed.

2. The method according to claim 1 wherein the computer compresses the data using a compression technique selected from the group consisting of: token tables, n-gram compression, serial day number compression, and binary number compression.

3. The method according to claim 1, further comprising:
   fragmenting, by the computer, the data elements in one or more fields of a record into fragmented data, wherein a fragmented datum is a data element in a field of a record that is a more granular than a parent data element, and wherein each fragmented datum is associated with a database field that is more granular; and
   storing, by the computer, the fragmented data contiguously in the same partition.

4. The method according to claim 3, further comprising:
   associating, by the computer, a fragmented record identifier with each of the fragmented datum, wherein the fragmented record identifier identifies the parent data element for a fragmented datum.

5. The method according to claim 1, further comprising:
   replacing, by the computer, a first data element object comprising the data elements in one or more fields of a first record with a data element notation object that references to a second data element object identical to the first data element object, wherein the second data element object comprises the data elements in one or more fields of a second record.

6. The method according to claim 5, further comprising:
   querying, by the computer, the database for the first object in response to a query received from a software module; and
   outputting, by the computer, to the software module the second object referenced by the referring object that replaced the first object.

7. The method according to claim 2, wherein the computer compresses the one or more fields using a token table technique, further comprising:
   adding, by the computer, one or more new fields storing new data to a record, wherein each field is associated with a token table;
   compressing, by the computer, the new field when the new data does not match existing data in the associated token table; and
   updating, by the computer, the token table using the new data of the new field.

8. The method according to claim 7, further comprising:
   decompressing, by the computer, data that is compressed according to an obsolete technique;
   compressing, by the computer, the data according to an improved compression technique.

9. The method according to claim 7, further comprising:
storing, by the computer, a higher weighted datum comprising frequency times length in a lower numbered index of a token table.

10. The method according to claim 2, wherein the computer compresses the one or more fields using a n-gram table technique, further comprising:
adding, by the computer, one or more new fields storing new data to a record, wherein each field is associated with a n-gram table;
compressing, by the computer, the new field when the new data does not match existing data in the associated n-gram table; and
updating, by the computer, the n-gram table using the new data of the new field.

11. The method according to claim 10, further comprising:
decompressing, by the computer, data that is compressed according to an obsolete technique; and
compressing, by the computer, the data according to an improved compression technique.

12. The method according to claim 11, further comprising:
storing, by the computer, a higher weighted datum comprising frequency times length in a lower numbered index of a n-gram table.

13. The method according to claim 2, further comprising:
searching, by the computer, a set of fields using an offset of a record descriptor byte;
decompressing, by the computer, accessed data at a field-level; and
returning, by the computer, the accessed data.

14. The method according to claim 13, further comprising:
halting, by the computer, decompression when a set of fields satisfying a query is found.

15. A computing system comprising:
one or more nodes storing one or more collections, each collection comprising a set of one or more records, each record comprising a set of fields storing data; and
a compression processor compressing one or more of the fields according to a schema that is associated with a collection,
wherein a record is an object comprising a plurality of fields that are grouped together according to the schema,
wherein a partition stores a value reference table having a reference value associated with an object, wherein the object is stored in a first record and comprises a plurality of grouped fields, and wherein a second record stores the reference value associated with the object according to the reference table.

16. A computing system comprising:
one or more nodes storing one or more collections, each collection comprising a set of one or more records, each record comprising a set of fields storing data;
a compression processor compressing one or more of the fields according to a schema that is associated with a collection; and
one or more output processors outputting one or more object values of an object to one or more module processors, wherein the object is stored in a record and comprises a plurality of grouped fields each containing an object value.

17. A computing system comprising:
one or more nodes storing one or more collections, each collection comprising a set of one or more records, each record comprising a set of fields storing data; and
a compression processor compressing one or more of the fields according to a schema that is associated with a collection, wherein the compression processor is configured to update a reference value associated with an object and stored in a first record, and wherein the reference value is updated according to an updated object stored in a second record.

18. A computing system comprising:
one or more nodes storing one or more collections, each collection comprising a set of one or more records, each record comprising a set of fields storing data;
a compression processor compressing one or more of the fields according to a schema that is associated with a collection; and
a token table store storing one or more token tables in non-transitory machine-readable storage memory, wherein each respective token table is associated with a field, and
wherein the compression processor adds one or more new fields having new data to a record according to each of the respective token tables associated with each of the respective new fields.

19. A computing system comprising:
one or more nodes storing one or more collections, each collection comprising a set of one or more records, each record comprising a set of fields storing data; and
a compression processor compressing one or more of the fields according to a schema that is associated with a collection, wherein the compression processor applies a compression technique when new data does not match existing data in a token table.

20. The system according to claim 19, wherein the compression processor updates the token table according to the new data when the new data does not match existing data in a token table.

21. The system according to claim 18, wherein the compression processor periodically updates the token table.

22. A computing system comprising:
one or more nodes storing one or more collections, each collection comprising a set of one or more records, each record comprising a set of fields storing data;
a compression processor compressing one or more of the fields according to a schema that is associated with a collection; and
an n-gram table store storing one or more n-gram tables, each n-gram table associated with a field, wherein the compression processor adds one or more new fields having new data to a record according to each of the n-gram tables associated with each of the new fields.

23. A computing system comprising:
one or more nodes storing one or more collections, each collection comprising a set of one or more records, each record comprising a set of fields storing data; and
a compression processor compressing one or more of the fields according to a schema that is associated with a collection, wherein the compression processor updates an n-gram table according to new data when the new data does not match existing data in a n-gram table.

24. The system according to claim 23, wherein the compression processor periodically updates the n-gram table.

25. The system according to claim 19, wherein the compression processor periodically updates the token table.

26. The system according to claim 22, wherein the compression processor periodically updates the n-gram table.

* * * * *